(12) United States Patent
Seo

(10) Patent No.: US 10,521,056 B2
(45) Date of Patent: Dec. 31, 2019

(54) TOUCH SCREEN PANEL AND DISPLAY DEVICE

(71) Applicant: LG DISPLAY CO., LTD., Seoul (KR)

(72) Inventor: SangWoo Seo, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 217 days.

(21) Appl. No.: 14/505,920

(22) Filed: Oct. 3, 2014

(65) Prior Publication Data

US 2015/0122625 A1    May 7, 2015

(30) Foreign Application Priority Data

Nov. 6, 2013    (KR) .................. 10-2013-0134101

(51) Int. Cl.
 *G06F 3/044*  (2006.01)
 *H03K 17/96*  (2006.01)

(52) U.S. Cl.
 CPC ......... *G06F 3/044* (2013.01); *H03K 17/9622* (2013.01); *G06F 2203/04112* (2013.01); *H03K 2017/9602* (2013.01); *H03K 2217/960705* (2013.01); *H03K 2217/960755* (2013.01)

(58) Field of Classification Search
 None
 See application file for complete search history.

(56) References Cited

U.S. PATENT DOCUMENTS

| 2009/0021267 A1 | 1/2009 | Golovchenko et al. |
| 2013/0049771 A1* | 2/2013 | Peng ................ G06F 3/0418 324/658 |
| 2014/0192009 A1* | 7/2014 | Lai .................. G06F 3/044 345/174 |

FOREIGN PATENT DOCUMENTS

| CN | 101699376 A | 4/2010 |
| CN | 102419670 A | 4/2012 |

OTHER PUBLICATIONS

Office Action dated Feb. 28, 2017 for Chinese Application No. 201410559696.1, 9 pages.

* cited by examiner

*Primary Examiner* — Parul H Gupta
(74) *Attorney, Agent, or Firm* — Seed IP Law Group LLP

(57) ABSTRACT

The present invention provides a touch screen panel and a display device which include a plurality of first electrodes arranged in a first direction in parallel; a plurality of second electrodes arranged in a second direction to intersect with the first electrodes; and a cover, wherein a width of at least one electrode of the first electrodes is different from widths of the other first electrodes, a width of at least one electrode of the second electrodes is different from widths of the other second electrodes, or the width of the at least one electrode of the first electrodes is different from the widths of the other first electrodes and the width of the at least one electrode of the second electrodes is different from the widths of the other second electrodes.

9 Claims, 7 Drawing Sheets

TOUCH SCREEN PANEL AND DISPLAY DEVICE

CROSS-REFERENCE TO RELATED APPLICATION

This application claims priority from and the benefit under 35 U.S.C. § 119(a) of Korean Patent Application No. 10-2013-0134101, filed on Nov. 6, 2013, which is hereby incorporated by reference for all purposes as if fully set forth herein.

BACKGROUND

1. Field of the Disclosure

The present disclosure relates to a touch screen panel and a display device.

2. Description of the Prior Art

Recently there has been much focus on display devices such as a liquid crystal display device, a field emission display device, a plasma display device, etc. due to their rapid response speed, low power consumption, and an excellent color reproduction rate. Such display devices are used for various electronic devices such as a TeleVision (TV), a computer monitor, a notebook computer, a mobile phone, a display unit of a refrigerator, a Personal Digital Assistant (PDA), an Automated Teller Machine (ATM), etc. In general, such display devices configure an interface with a user using various input devices such as a keyboard, a mouse, a digitizer, etc.

However, there is a problem in that, in order to use a separate input device such as a keyboard, a mouse, etc., a user should become proficient in a method of using them and the separate input device occupies a space, thereby causing user's dissatisfaction. Thus, an input device, which is convenient and simple and can reduce malfunctions thereof, has been demanded more and more. According to the demand, a touch screen panel, to which a user inputs information by making a finger or a pen thereof directly contact a screen, has been proposed.

The touch screen panel is classified into a resistive scheme which determines a touched portion by using a voltage gradient according to a resistor in a state in which a metal electrode is formed on an upper plate or a lower plate thereof to apply a direct current voltage thereto, a capacitive scheme which detects a touched portion by detecting a location where a change in voltage of the upper/lower plate according to a touch in a state in which an equipotentiality is formed on a conductive film, and an electromagnetic scheme which detects a touched portion by reading an LC value induced due to a touch on a conductive film by an electronic pen, according to a scheme of detecting a touched portion. In addition, an optical scheme and a surface acoustic wave scheme have been known.

The capacitive scheme has a matrix formed by intersecting electrode patterns, and has an advantage in that, when a touch is generated at a predetermined location on the matrix, a touched location is detected by finding an X-axis coordinate and a Y-axis coordinate on the matrix where a capacitance thereof is varied, thereby detecting the touched location even when a contact force is small.

However, a capacitive type touch screen panel according to the related art has a problem in that, since a shape or a width of electrodes formed at a lower portion of a cover may not be uniform, when the thickness of the cover is not uniform due to importance of design of a product, accuracy in detecting a change in a capacitance is reduced.

SUMMARY

An aspect of the present invention is to provide a touch screen panel and a display device having a reliability by preventing a touch input accuracy of the touch screen panel from being reduced.

A touch screen panel includes a plurality of first electrodes arranged in a first direction in parallel; a plurality of second electrodes arranged in a second direction to intersect with the first electrodes; and a cover, wherein a width of at least one electrode of the first electrodes is different from widths of the other first electrodes, a width of at least one electrode of the second electrodes is different from widths of the other second electrodes, or the width of the at least one electrode of the first electrodes is different from the widths of the other first electrodes and the width of the at least one electrode of the second electrodes is different from the widths of the other second electrodes.

A display device includes a display panel; and a touch screen panel which includes a plurality of first electrodes arranged in a first direction in parallel; a plurality of second electrodes arranged in a second direction to intersect with the first electrodes; and a cover, wherein a width of at least one electrode of the first electrodes is different from widths of the other first electrodes, a width of at least one electrode of the second electrodes is different from widths of the other second electrodes, or the width of the at least one electrode of the first electrodes is different from the widths of the other first electrodes and the width of the at least one electrode of the second electrodes is different from the widths of the other second electrodes.

The present invention can improve a reliability of a touch screen panel and a display device by increasing a touch input accuracy.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EXEMPLARY EMBODIMENTS

Figure 1:
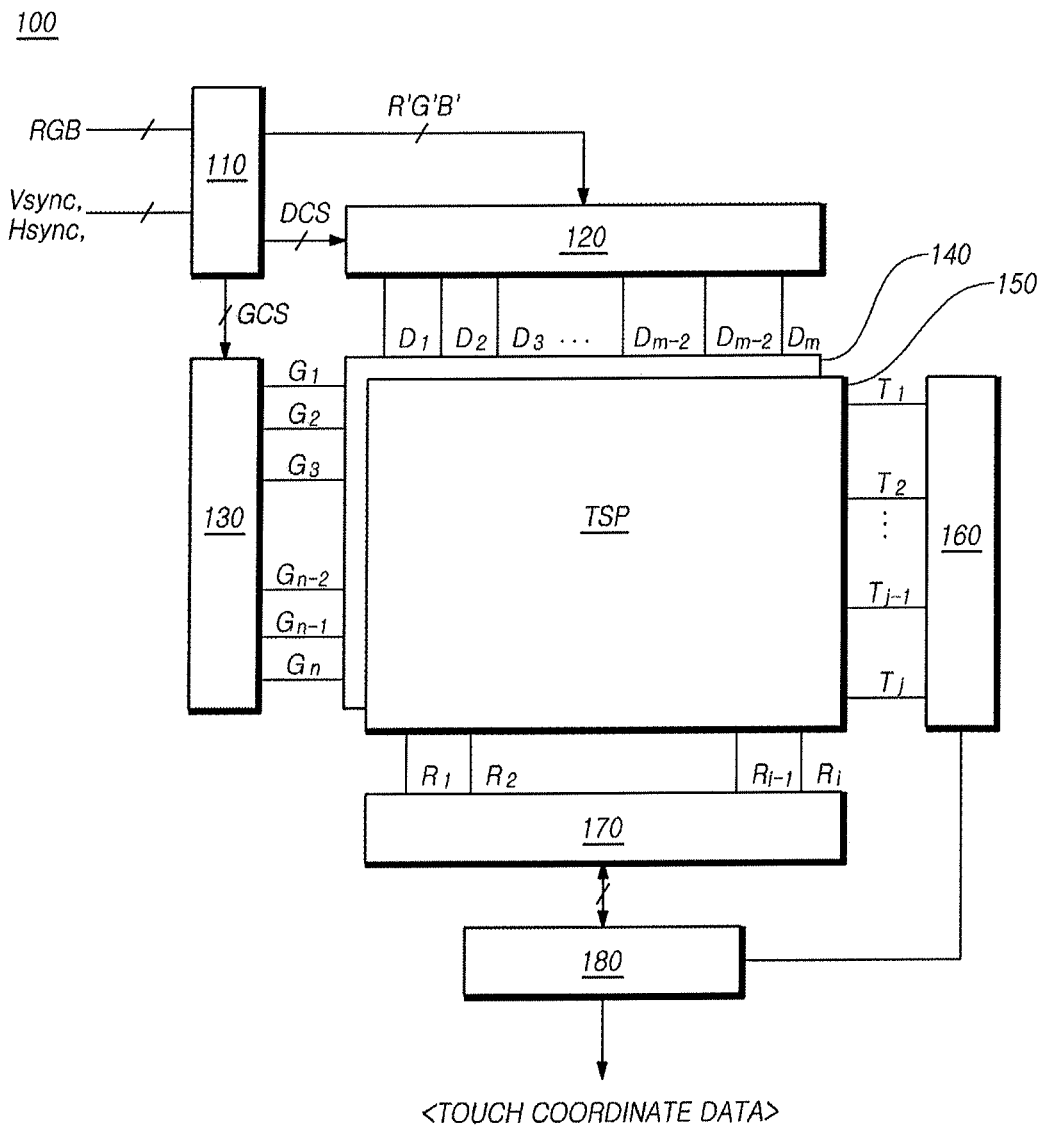
FIG. 1 illustrates a system configuration of a display device to which embodiments of the present invention are applied.

Hereinafter, some embodiments of the present invention will be described with reference to the accompanying drawings. In the following description, the same elements will be designated by the same reference numerals although they are shown in different drawings. Further, in the following description of embodiments of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. These terms are merely used to distinguish one structural element from other structural elements, and a property, an order, a sequence and the like of a corresponding structural element are not limited by the term. It should be noted that if it is described in the specification that one component is "connected," "coupled" or "joined" to another component, a third component may be "connected," "coupled," and "joined" between the first and second components, although the first component may be directly connected, coupled or joined to the second component. Likewise, when it is described that a certain element is formed "on" or "under" another element, it should be understood that the certain element may be formed either directly or indirectly via a still another element on or under another element.

FIG. 1 illustrates a system configuration of a display device to which embodiments of the present invention are applied.

Referring to FIG. 1, a display device 100 includes a display panel 140, a data driving unit 120, a gate driving unit 130, a timing controller 110, a touch screen panel 150, touch screen driving circuits 160 and 170, a touch controller 180, etc. At this time, the timing controller 110 and the touch controller 180 may be integrally formed.

The display device according to embodiments may correspond to a flat plate display device such as a Liquid Crystal Display (LCD) device, a Field Emission Display (FED) device, a Plasma Display Panel (PDP), an Organic Light Emitting Display (OLED) device, an ElectroPhoresis Display (EPD) device, etc.

The display panel 140 has a plurality of data lines D1 to Dm (m is a natural number), a plurality of gate lines G1 to Gn (n is a natural number) intersecting with the data lines D1 to Dm, a plurality of thin film transistors formed in intersection portions between the data lines D1 to Dm and the gate lines G1 to Gn, a plurality of pixel electrodes, etc., which are formed on a lower substrate thereof.

Next, the timing controller 110 outputs a Data Control Signal (DCS) for controlling the data driving unit 120 based on an external timing signal such as a vertical/horizontal synchronization signal, a video signal RGB, a clock signal CLK, etc. input from a host system, and a Gate Control Signal (GCS) for controlling the gate driving unit 130. Further, the timing controller 110 may convert the video signal RGB input from the host system into a data signal used by the data driving unit 120, to supply the converted video signal R'G'B' to the data driving unit 120. As an example, the timing controller 110 may convert the video signal RGB in accordance with a resolution or a pixel structure of the display panel 140 to supply the converted video signal R'G'B' to the data driving unit 120. Herein, the video signal RGB and the converted video signal R'G'B' may also refer to video digital data, video data, or data.

The data driving unit 120 converts the converted video signal into a data signal (an analog pixel signal or a data voltage) which is a voltage value corresponding to a gradation value, to supply the converted data signal to a data line, in response to the DCS and the converted video signal R'G'B' input from the timing controller 110.

The gate driving unit 130 sequentially supplies a scan signal (a gate pulse or a scan pulse and a gate-on signal) to a gate line in response to the GCS input from the timing controller 110.

Meanwhile, the touch screen panel 150 includes an insulation member and a cover. The touch screen panel 150 may be in contact with the upper flat plate of the display panel 140 or may be formed between the insulation member and the cover. Further, the touch screen panel 150 may be formed on a substrate together with a pixel within the display panel 140 while having an in-cell type.

The touch screen panel 150 includes first electrodes $T_1$ to $T_j$ (j is a natural number) formed on the insulation member and second electrodes $R_1$ to $R_i$ (i is a natural number) intersecting with the first electrodes $T_1$ to $T_j$.

Although i and j are specifically illustrated in FIGS. 2 to 7, the number of the electrodes is not limited thereto.

The touch screen panel 150 includes the plurality of first electrodes $T_1$ to $T_k$ arranged in a first direction in parallel to each other, the plurality of second electrodes $R_1$ to $R_i$ arranged in a second direction to intersect with the first electrodes $T_1$ to $T_j$, and the cover, wherein the width of at least one first electrode among the first electrodes $T_1$ to $T_j$ is different from the widths of other first electrodes, the width of at least one second electrode among the second electrodes $R_1$ to $R_i$ is different from the widths of other second electrodes, or the width of at least one first electrode among the first electrodes $T_1$ to $T_j$ is different from the widths of other first electrodes and the width of at least one second electrode among the second electrodes $R_1$ to $R_i$ is different from the widths of other second electrodes.

In other words, the widths of the first electrodes $T_1$ to $T_j$ of the touch screen panel 150 may be different from each other. The widths of the second electrodes $R_1$ to $R_i$ of the touch screen panel 150 may also be different from each other. By configuring the widths to be different from each other, when the thicknesses of areas of the cover are different from each other, a capacitance can be maintained constant, so that the a touch input accuracy may be improved.

The touch screen panel 150 detects a touch by using a mutual capacitance scheme of detecting generation of a touch event and coordinates of a touched location by measuring a change in the capacitance formed between the first electrodes $T_1$ to $T_j$ and the second electrodes $R_1$ to $R_i$ according to a touch of a pointer (e.g. a finger, etc.).

Although the touch screen panel 150 using the mutual capacitance scheme is described below, embodiments are not limited thereto, and the present invention can be applied to a touch screen panel using a self capacitance scheme.

Next, the touch screen driving units 160 and 170 include a first electrode driving unit 160 and a second electrode driving unit 170.

The first electrode driving unit 160 configures a first electrode for outputting a touch driving pulse under a control of the touch controller 180. Further, the first electrode driving unit 160 generates the touch driving pulse under the control of the touch controller 180, and supplies the touch driving pulse to the first electrodes $T_1$ to $T_j$ connected thereto.

The second electrode driving unit 170 receives a voltage through the second electrodes $R_1$ to $R_i$, and samples a sensing voltage thereof according to a sensing enable signal input from the touch controller 180. Further, the second electrode driving unit 170 converts the sampling voltage into touch raw data which is digital data, to transmit the converted sampling voltage to the touch controller 180.

Next, the touch controller 180 outputs touch coordinate data through an interface such as an I2C bus, a Serial Peripheral Interface (SPI), a system bus, etc.

Meanwhile, another aspect of the present invention is to provide a display device including a display panel 140 and a touch screen panel including the plurality of first electrodes $T_1$ to $T_k$ arranged in a first direction in parallel to each other, the plurality of second electrodes $R_1$ to $R_i$ arranged in a second direction to intersect with the first electrodes $T_1$ to $T_j$, and the cover, wherein the width of at least one first electrode among the first electrodes $T_1$ to $T_j$ is different from the widths of other first electrodes, the width of at least one second electrode among the second electrodes $R_1$ to $R_i$ is different from the widths of other second electrodes, or the width of at least one first electrode among the first electrodes $T_1$ to $T_j$ is different from the widths of other first electrodes and the width of at least one second electrode among the second electrodes $R_1$ to $R_i$ is different from the widths of other second electrodes.

Although the display panel may be one of a liquid crystal panel, a field emission panel, a plasma display, an organic light emitting diode panel, and an electrophoresis panel, the present invention is not limited thereto.

The display device 100 is completely formed by separately manufacturing the display panel 140 and the touch screen panel 150 and by integrally forming them. The integral forming process may be performed by a process of forming a sacrificial layer between two panels and then separating the sacrificial layer, or by optical irradiation.

Hereinabove, an overall system and an overall display device to which embodiments are applied have been described. However, hereinafter, the touch screen panel 150 to which embodiments are applied will be described in detail.

Figure 2:
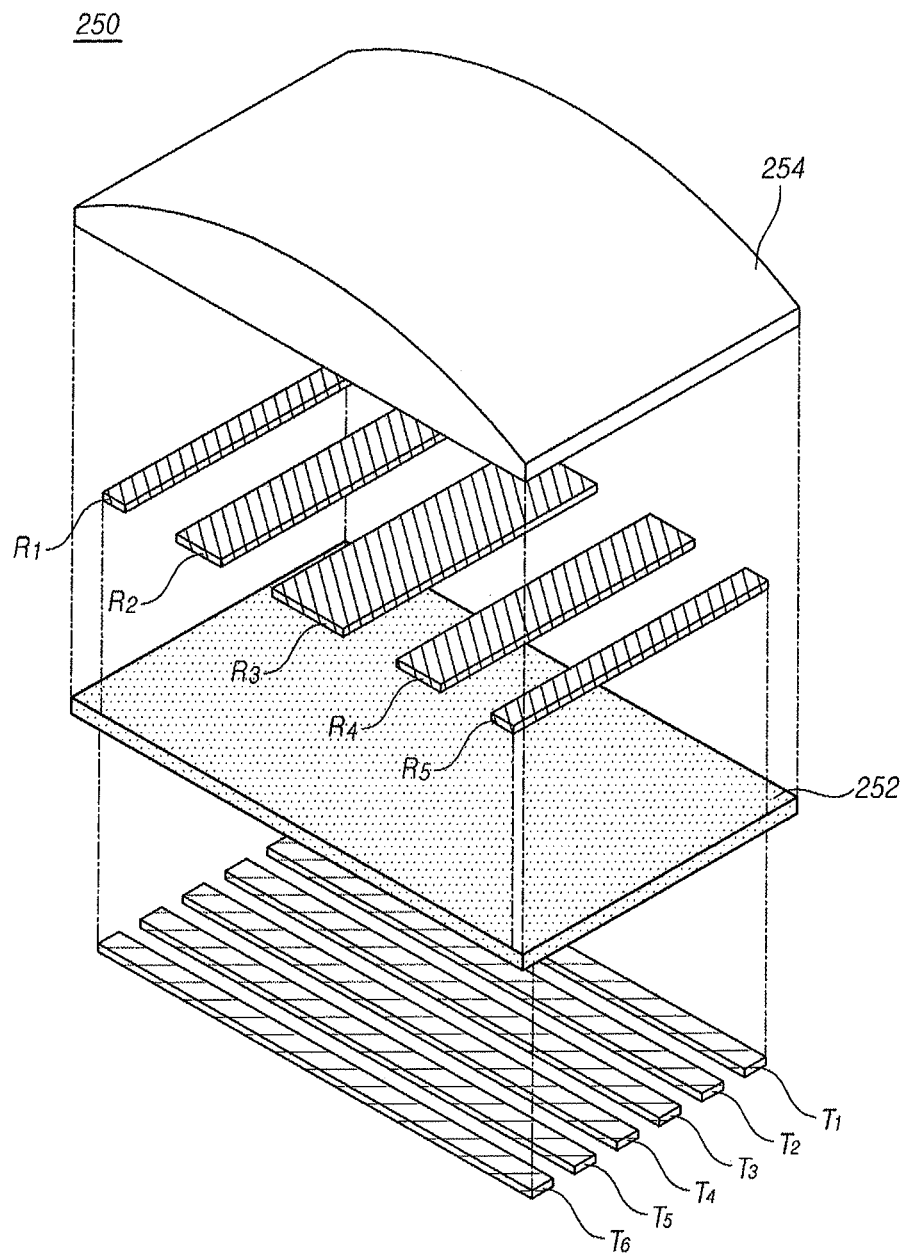
FIG. 2 is an exploded perspective view illustrating a touch screen panel according to a first embodiment.
Figure 3:
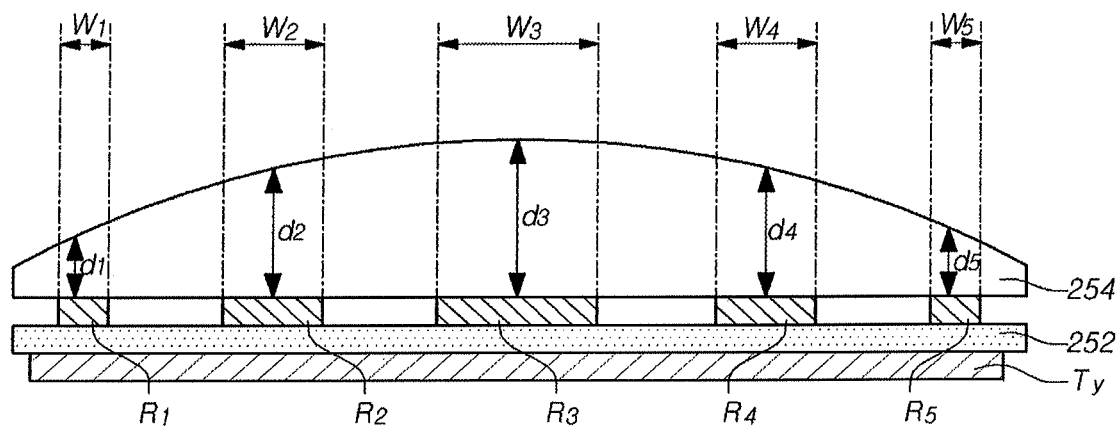
FIG. 3 is a sectional view illustrating a touch screen panel according to a first embodiment.
Figure 4:
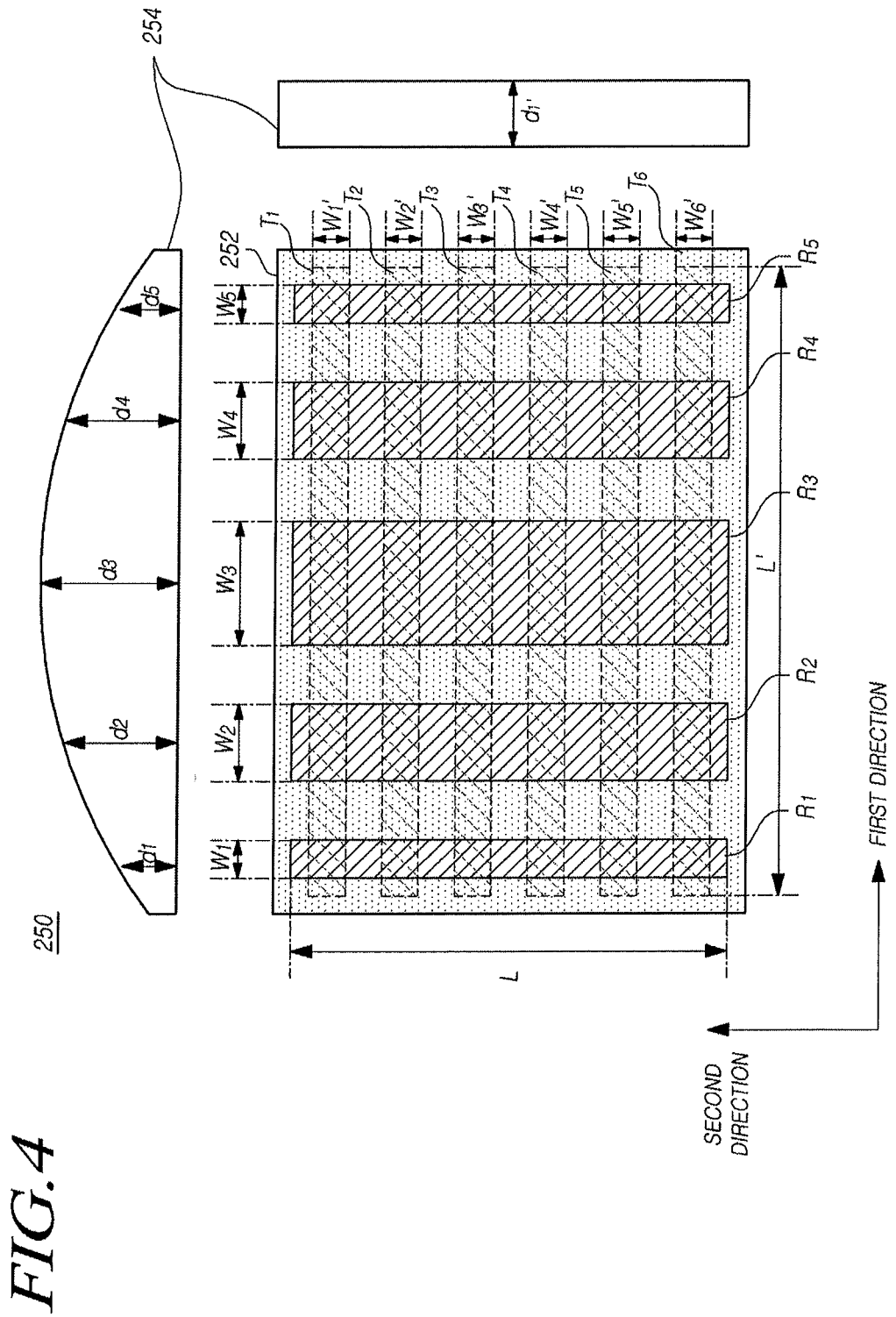
FIG. 4 is a plan view illustrating a touch screen panel according to a first embodiment.

FIG. 2 is an exploded perspective view illustrating a touch screen panel according to a first embodiment, FIG. 3 is a sectional view illustrating the touch screen panel according to the first embodiment, and FIG. 4 is a plan view illustrating the touch screen panel according to the first embodiment.

Referring to FIGS. 2 to 4, a touch screen panel 250 includes an insulation member 252, 6 first electrodes $T_1$ to $T_6$ (j is equal to six) formed on one surface of the insulation member 252 and arranged in a first direction in parallel to each other, 5 second electrodes $R_1$ to $R_5$ (i is equal to five) formed on the other surface of the insulation member 252 and arranged in a second direction to intersect the first electrodes $T_1$ to $T_6$, and a cover 254.

A length L' is defined as the length of the first electrodes $T_1$ to $T_6$, a length L is defined as the length of the second electrodes $R_1$ to $R_5$, a first direction is defined as the lengthwise direction of the first electrodes $T_1$ to $T_6$, and a second direction is defined as the lengthwise direction of the second electrodes $R_1$ to $R_5$. Further, widths $w_1'$ to $w_6'$ are defined as the widths of the first electrodes $T_1$ to $T_6$, and widths $w_1$ to $w_5$ are defined as the widths of the second electrodes $R_1$ to $R_5$. In a case of the cover 254, thicknesses $d_1$ to $d_5$ are defined as the thicknesses of sectional surfaces in the first direction of the cover 254. At this time, the thicknesses $d_1$ to $d_5$ are defined as the average thicknesses in areas of the cover 554 located on the second electrodes $R_1$ to $R_5$. Meanwhile, a thickness $d_1'$ is defined as the thickness of a sectional surface of the cover 254 in the second direction.

The first electrodes $T_1$ to $T_6$ are located on one surface (lower surface) of the insulation member 252, and the widths $w_1'$ to $w_6'$ are formed to be equal to each other ($w_1'=w_2'=w_3'=w_4'=w_5'=w_6'$). The first electrodes $T_1$ to $T_6$ may be driving electrodes, and may receive a touch driving pulse from the first electrode driving unit 160 under the control of the touch controller 180.

The insulation member 252 is formed of an inorganic insulation material such as silicon nitride (SiNx), and is located between the first electrodes $T_1$ to $T_6$ and the second electrodes $R_1$ to $R_5$. The insulation member 252 functions as a dielectric material, which insulates the first electrodes $T_1$ to $T_6$ and the second electrodes $R_1$ to $R_5$.

Meanwhile, the second electrodes $R_1$ to $R_5$ are located on the other surface (upper surface) of the insulation member 252, are arranged in the second direction to intersect the first electrodes $T_1$ to $T_6$, and have the widths $w_1$ to $w_5$ which are different from each other. In detail, a relationship of "$w_1<w_2<w_3>w_4>w_5$" is established. That is, the width $w_3$ of the second electrode $R_3$ among the second electrodes $R_1$ to $R_5$ is formed to be the thickest, and the widths $w_1$ and $w_5$ of the second electrode $R_1$ and $R_5$ at opposite sides are formed to be the thinnest. This configuration is formed to correspond to the thicknesses $d_1$ to $d_5$ of the cover 254.

The second electrodes $R_1$ to $R_5$ may be sensing electrodes, and the second electrode driving unit 170 receives a voltage through the second electrodes $R_1$ to $R_5$, and samples a sensing voltage thereof according to a sensing enable signal input from the touch controller 180.

Here, an electrode material of the first electrodes $T_1$ to $T_6$ and the second electrodes $R_1$ to $R_5$ may be one of a transparent conductive material having a high optical transmittance, a conductive polymer, etc. such as Indium Tin Oxide (ITO), Indium Zinc Oxide (IZO), Oxide/Metal/Oxide (OMO), ITO/metal (e.g. Ag)/ITO, IZO/metal (e.g. Ag)/IZO, Ag Nano-wire, metal mesh, graphene, a Carbon Nano Tube (CNT), etc.

Further, the first electrodes T1 to T6 and the second electrodes R1 to R5 may be patterned in a photolithography scheme which performs a process of sputtering and then performs processes of exposure, development, etching, etc.

The touch screen panel 250 include the cover 254, and the cover 254 may be attached by an optical adhesive such as an Optical Cleared Adhesive (OCA), and may be formed of one material of glass, strengthened glass, a high molecular material, a transparent metal, etc.

The thickness of the cover 254 may not be uniform. First, a central portion of a sectional surface of the cover 254 in the first direction corresponding to the lengthwise direction of the first electrodes $T_1$ to $T_6$ has a convex shape. In other words, the thicknesses $d_1$ to $d_5$ have a relationship of "$d_1<d_2<d_3>d_4>d_5$", and are formed to have a uniform curvature. Meanwhile, the thickness $d_1'$ of a sectional area of the cover 254 in the second direction corresponding to the lengthwise direction of the second electrodes $R_1$ to $R_5$ is formed uniformly. As a result, when the cover 254 is viewed from the upper side, the cover 254 has a semicylindric shape as illustrated in FIG. 2.

Figure 5:
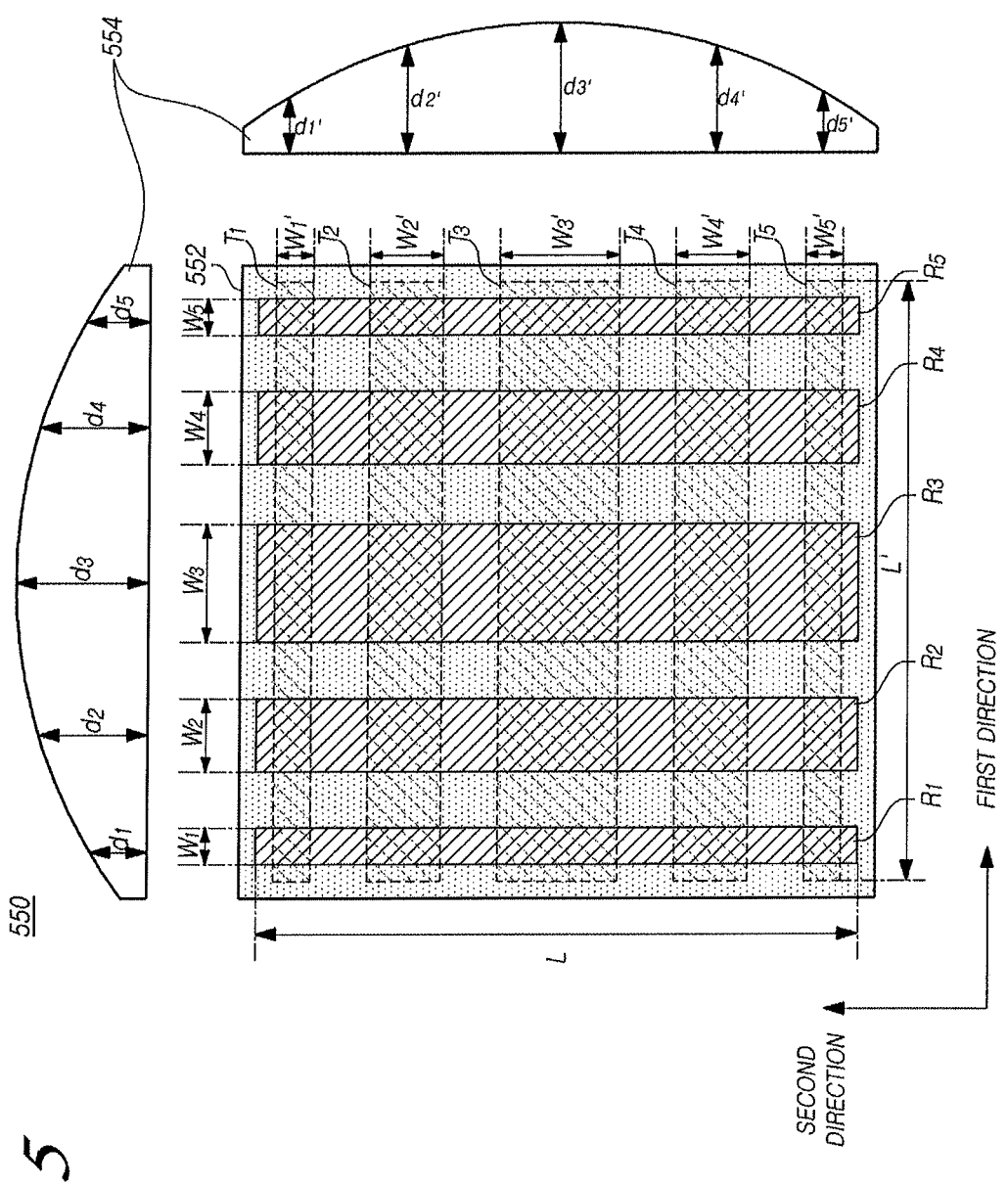
FIG. 5 is a plan view illustrating a touch screen panel according to a second embodiment.

FIG. 5 is a plan view illustrating a touch screen panel according to a second embodiment.

Referring to FIG. 5, a touch screen panel 550 includes an insulation member 552, 5 first electrodes $T_1$ to $T_5$ (j is equal to five) formed on one surface of the insulation member 552 and arranged in a first direction in parallel to each other, 5 second electrodes $R_1$ to $R_5$ (i is equal to five) formed on the other surface of the insulation member 552 and arranged in a second direction to intersect the first electrodes $T_1$ to $T_5$, and a cover 554.

A length L' is defined as the length of the first electrodes $T_1$ to $T_5$, a length L is defined as the length of the second electrodes $R_1$ to $R_5$, a first direction is defined as the lengthwise direction of the first electrodes $T_1$ to $T_5$, and a second direction is defined as the lengthwise direction of the second electrodes $R_1$ to $R_5$. Further, widths $w_1'$ to $w_5'$ are defined as the widths of the first electrodes $T_1$ to $T_5$, and widths $w_1$ to $w_5$ are defined as the widths of the second electrodes $R_1$ to $R_5$. In a case of the cover 554, thicknesses $d_1$ to $d_5$ are defined as the thicknesses of sectional surfaces in the first direction of the cover 554. At this time, the thicknesses $d_1$ to $d_5$ are defined as the average thicknesses in areas of the cover 554 located on the second electrodes $R_1$ to $R_5$. Meanwhile, thicknesses $d_1'$ to $d_5'$ are defined as the thicknesses of a sectional surface in the second direction of the cover 554, and the thicknesses $d_1'$ to $d_5'$ are defined as the average thicknesses of the area of the cover 554 located on the first electrodes $T_1$ to $T_5$.

The first electrodes $T_1$ to $T_5$ are arranged in parallel on one surface (lower surface) of the insulation member 552, and the widths $w_1'$ to $w_5'$ are formed to be different from each other ($w_1' < w_2' < w_3' > w_4' > w_5'$).

The first electrodes $T_1$ to $T_5$ may be driving electrodes, and may receive a touch driving pulse from the first electrode driving unit 160 under the control of the touch controller 180.

Meanwhile, the second electrodes $R_1$ to $R_5$ are located on the other surface (upper surface) of the insulation member 552, are arranged in the second direction to intersect the first electrodes $T_1$ to $T_5$, and have the widths $w_1$ to $w_5$ which are different from each other. In detail, a relationship of "$w_1 < w_2 < w_3 > w_4 > w_5$" is established.

The second electrodes $R_1$ to $R_5$ may be sensing electrodes, and the second electrode driving unit 170 receives a voltage through the second electrodes $R_1$ to $R_5$, and samples a sensing voltage thereof according to a sensing enable signal input from the touch controller 180.

The width $w_3'$ of the first electrode $T_3$ among the first electrodes $T_1$ to $T_5$ and the width $w_3$ of the second electrode $R_3$ among the second electrodes $R_1$ to $R_5$ are formed to be the thickest, and the widths $w_1$, $w_5$, $w_1'$ and $w_5'$ are formed to be the thinnest. This configuration is formed to correspond to the thicknesses $d_1$ to $d_5$ and $d_1'$ to $d_5'$ of the cover 554.

The material and the manufacturing method of the first electrodes $T_1$ to $T_5$ and the second electrodes $R_1$ to $R_5$ are equal to the contents described in FIGS. 2 to 4.

Meanwhile, the thickness of the cover 554 according to the second embodiment may not be uniform. First, a central portion of a sectional surface of the cover 554 in the first direction corresponding to the lengthwise direction of the first electrodes $T_1$ to $T_5$ has a convex shape. In other words, the thicknesses $d_1$ to $d_5$ have a relationship of "$d_1 < d_2 < d_3 > d_4 > d_5$", and are formed to have a uniform curvature.

Further, unlike the first embodiment, a central portion of a sectional surface of the cover 554 in the second direction corresponding to the lengthwise direction of the second electrodes $R_1$ to $R_5$ has a convex shape, and the thicknesses $d_1'$ to $d_5'$ have a relationship of "$d_1' < d_2' < d_3' > d_4' > d_5'$" and are formed to have a uniform curvature. Although not illustrated, when viewed from the upper side, the cover 554 has a semispheric shape.

Figure 6:
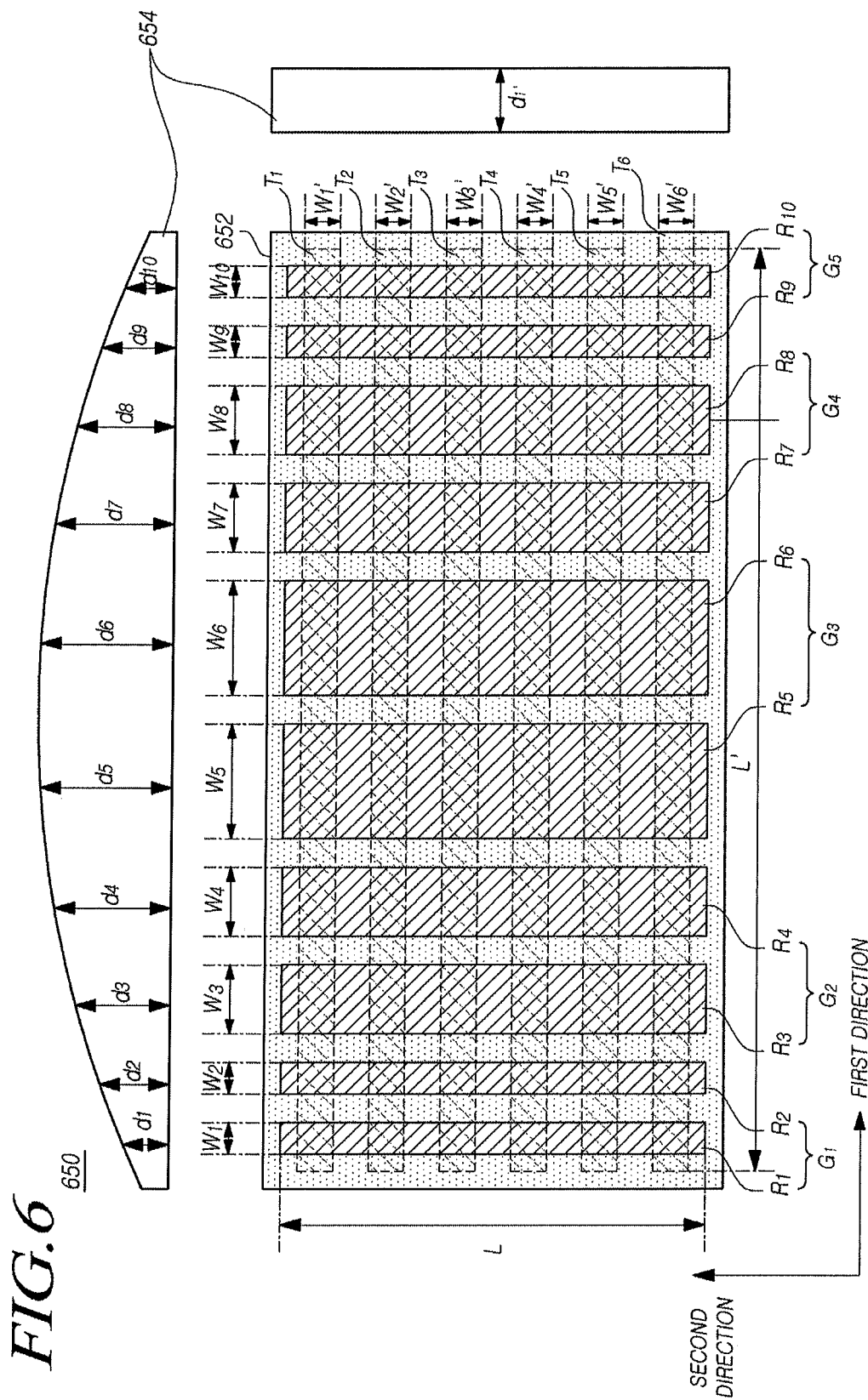
FIG. 6 is a plan view illustrating a touch screen panel according to a third embodiment.

FIG. 6 is a plan view illustrating a touch screen panel according to a third embodiment.

Referring to FIG. 6, a touch screen panel 650 includes an insulation member 652, 6 first electrodes $T_1$ to $T_6$ (j is equal to six) formed on one surface of the insulation member 652 and arranged in a first direction in parallel to each other, 10 second electrodes $R_1$ to $R_{10}$ (i is equal to ten) formed on the other surface of the insulation member 652 and arranged in a second direction to intersect the first electrodes $T_1$ to $T_6$, and a cover 654.

A length L' is defined as the length of the first electrodes $T_1$ to $T_6$, a length L is defined as the length of the second electrodes $R_1$ to $R_{10}$, a first direction is defined as the lengthwise direction of the first electrodes $T_1$ to $T_6$, and a second direction is defined as the lengthwise direction of the second electrodes $R_1$ to $R_{10}$. Further, widths $w_1'$ to $w_6'$ are defined as the widths of the first electrodes $T_1$ to $T_6$, and widths $w_1$ to $w_{10}$ are defined as the widths of the second electrodes $R_1$ to $R_n$. In a case of the cover 654, thicknesses $d_1$ to $d_{10}$ are defined as the thicknesses of sectional surfaces in the first direction of the cover 654. At this time, the thicknesses $d_1$ to $d_{10}$ are defined as the average thicknesses of areas of the cover 654 located on the second electrodes $R_1$ to $R_{10}$. Meanwhile, a thickness $d_1'$ is defined as the thickness of a sectional surface in the second direction of the cover 654, and the thickness $d_1'$ is defined as the average thickness of the area of the cover 654 located on the first electrodes $T_1$ to $T_6$.

The first electrodes $T_1$ to $T_6$ are located in parallel on one surface (lower surface) of the insulation member 652, and the widths $w_1'$ to $w_6'$ are formed to be equal to each other ($w_1' = w_2' = w_3' = w_4' = w_5' = w_6'$).

Meanwhile, the second electrodes $R_1$ to $R_{10}$ are located on the other surface (upper surface) of the insulation member 652, are arranged in the second direction to intersect the first electrodes $T_1$ to $T_6$, and have the widths $w_1$ to $w_{10}$ which are different from each other.

Unlike the aforementioned embodiments, the second electrodes $R_1$ to $R_{10}$ according to the third embodiment are classified into electrode groups $G_1$ to $G_5$, and widths of electrodes in at least one electrode group among the electrode groups $G_1$ to $G_5$ are equal to each other, and are different from widths of electrodes in the other electrode groups thereamong. In detail, a relationship of "$(w_1 = w_2) < (w_3 = w_4) < (w_5 = w_6) > (w_7 = w_8) > (w_9 = w_{10})$" is established.

That is, the second electrodes $R_1$ to $R_{10}$ are classified into five electrode groups. That is, the second electrodes $R_1$ and $R_2$ constitute the first electrode group $G_1$, the second electrodes $R_3$ and $R_4$ constitute the first electrode group $G_2$, the second electrodes $R_5$ and $R_6$ constitute the first electrode group $G_3$, the second electrodes $R_7$ and $R_8$ constitute the first electrode group $G_4$, and the second electrodes $R_9$ and $R_{10}$ constitute the first electrode group $G_5$. The widths $w_1$ and $w_2$ of the second electrodes $R_1$ and $R_2$ in the first electrode group $G_1$ are equal to each other, and are different from the widths $w_3$ to $w_{10}$ of the second electrodes $R_3$ to $R_{10}$ in the other electrode groups $G_2$ to $G_5$. Likewise, in cases of the other electrode groups $G_2$ to $G_5$, the widths of the second electrodes in the same electrode group are equal to each other, and are different from the widths of the second electrodes in the other electrode groups.

The thickness of the cover 654 may not be uniform. First, a central portion of a sectional surface of the cover 654 in the first direction corresponding to the lengthwise direction of the first electrodes $T_1$ to $T_6$ has a convex shape. In other words, the thicknesses $d_1$ to $d_{10}$ have a relationship of "$d_1 < d_2 < d_3 < d_4 < d_5 = d_6 > d_7 > d_8 > d_9 > d_{10}$", and are formed to have a uniform curvature.

Meanwhile, the thickness $d_1'$ of a sectional area of the cover 654 in the second direction corresponding to the lengthwise direction of the second electrodes $R_1$ to $R_5$ is formed uniformly. As a result, when viewed from the upper side, the cover 654 has a semicylindric shape.

Figure 7:
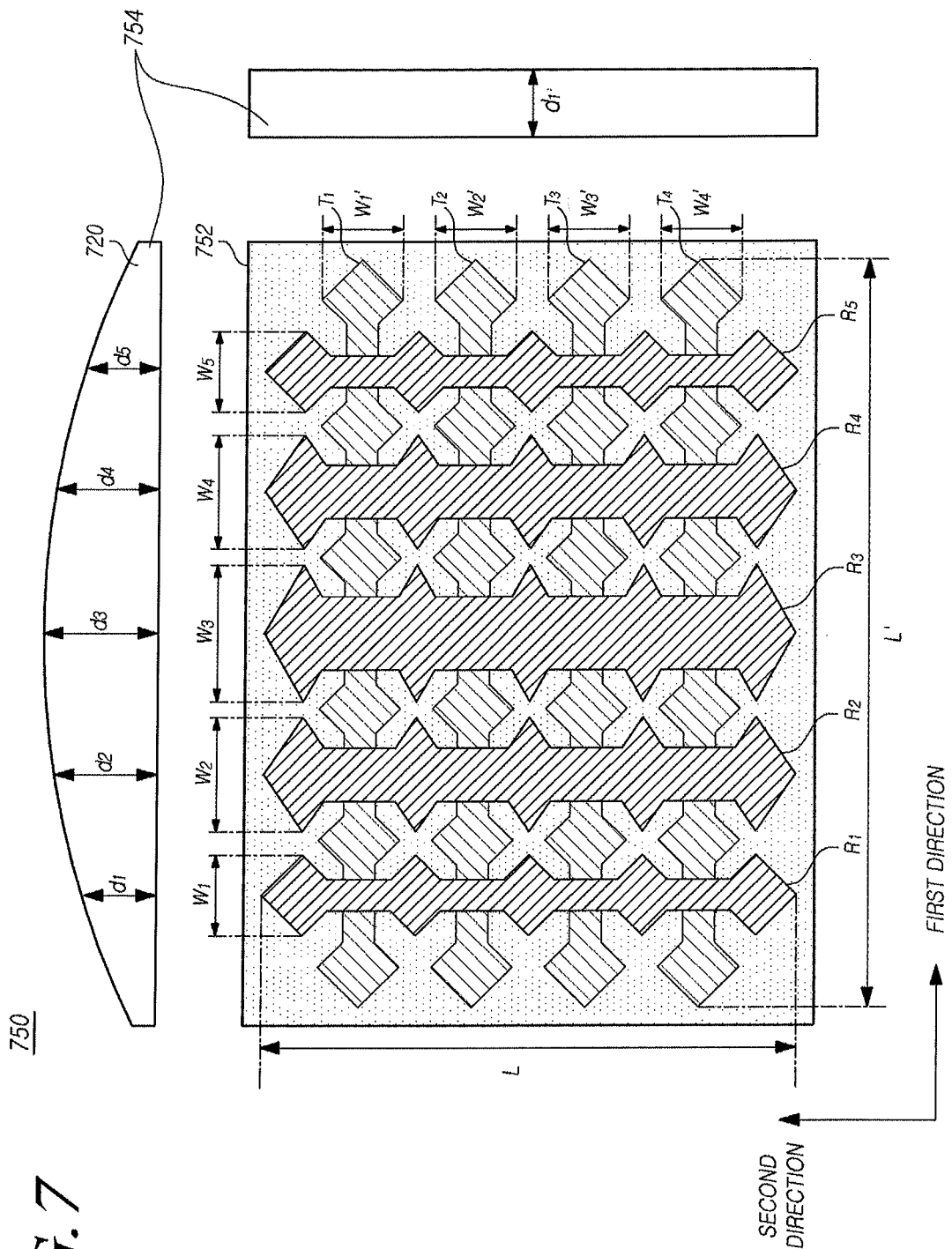
FIG. 7 is a plan view illustrating a touch screen panel according to a fourth embodiment.

FIG. 7 is a plan view illustrating a touch screen panel according to a fourth embodiment.

Referring to FIG. 7, a touch screen panel 750 includes an insulation member 752, 4 first electrodes $T_1$ to $T_4$ (j is equal to four) formed on one surface of the insulation member 752 and arranged in a first direction in parallel to each other, 5 second electrodes $R_1$ to $R_5$ (i is equal to five) formed on the other surface of the insulation member 752 and arranged in a second direction to intersect the first electrodes $T_1$ to $T_4$, and a cover 754.

A length L' is defined as the length of the first electrodes $T_1$ to $T_4$, a length L is defined as the length of the second electrodes $R_1$ to $R_5$, a first direction is defined as the lengthwise direction of the first electrodes $T_1$ to $T_4$, and a second direction is defined as the lengthwise direction of the second electrodes $R_1$ to $R_5$. Further, widths $w_1'$ to $w_4'$ are defined as the widths of the first electrodes $T_1$ to $T_4$, and widths $w_1$ to $w_5$ are defined as the widths of the second electrodes $R_1$ to $R_5$. In a case of the cover 754, thicknesses $d_1$ to $d_5$ are defined as the thicknesses of sectional surfaces in the first direction of the cover 754. At this time, the thicknesses $d_1$ to $d_5$ are defined as the average thicknesses of areas of the cover 754 located on the second electrodes $R_1$ to $R_5$. Meanwhile, a thickness $d_1'$ is defined as the thickness of a sectional surface in the second direction of the cover 754.

The first electrodes $T_1$ to $T_4$ and the second electrodes $R_1$ to $R_5$ in the touch screen panel 750 include a diamond-shaped pattern shape.

Although not illustrated, the touch screen panel 750 may include a dummy pattern for improving a visibility on an empty surface of the insulation member 752, and such a dummy pattern may diversely vary according to a shape of the first electrodes $T_1$ to $T_4$ and the second electrodes $R_1$ to $R_5$.

Meanwhile, the touch screen panel 750 may employ a self capacitive scheme.

The insulation member 752 according to a fourth embodiment has the first electrodes $T_1$ to $T_4$ and the second electrodes $R_1$ to $R_5$ which are formed on one surface thereof. In a case of the touch screen panel 750 employing a mutual capacitive scheme, one of the first electrodes $T_1$ to $T_4$ and the second electrodes $R_1$ to $R_5$ may be a driving electrode or a sensing electrode, so that an insulation layer may be separately formed at a location where the first electrodes $T_1$ to $T_4$ and the second electrodes $R_1$ to $R_5$ intersect with each other.

However, in a case of the touch screen panel 750 employing a self capacitive scheme, a change in a capacitance of each of the electrodes is detected, so that a separate insulation layer is unnecessary.

The thickness of the cover 754 may not be uniform. First, a central portion of a sectional surface of the cover 254 in the first direction corresponding to the lengthwise direction of the first electrodes $T_1$ to $T_4$ has a convex shape. In other words, the thicknesses $d_1$ to $d_5$ have a relationship of "$d_1 < d_2 < d_3 > d_4 > d_5$", and are formed to have a uniform curvature. Meanwhile, the thickness $d_1'$ of a sectional area of the cover 754 in the second direction corresponding to the lengthwise direction of the second electrodes $R_1$ to $R_5$ is formed uniformly. As a result, when viewed from the upper side, the cover 754 has a semicylindric shape.

Hereinabove, the structure of the touch screen panel 150 according to the embodiments has been described, and hereinafter, effects of the embodiments will be described.

Currently, various designs of a display product such as a television, a computer, a clock, etc. are required. Therefore, the embodiments of the present invention are conceived to improve touch input accuracy by constantly maintaining a capacitance between electrodes within the cover 254 in accordance with the various designs of the cover 254.

When described with reference to FIGS. 1 to 7, the thickness of a first area of the cover 254 and the thickness of a second area of the cover 254 may be formed to be different from each other in one of the first direction and the second direction. The first area is defined as an area corresponding to an area of one electrode among second electrodes $R_i$, and the second area is defined as the other areas of the cover 254 except for the first area.

Accordingly, a shape of an upper surface of the cover 254 may be formed diversely, and may also be formed irregularly. However, in the drawings, for the convenience of understanding, the covers 254, 554, 654 and 754 having a uniform curvature have been illustrated.

Equation (1) is an equation for calculating a value of a capacitance $C_i$.

[Equation (1)]

$$C_i = \varepsilon \times (A_i/d_i) = \varepsilon \times (w_i \times L/d_i) \quad (1)$$

(Ci: Capacitance, ε: permittivity of insulation member, Ai: area of second electrode, di: thickness of cover, wi: width of second electrode, i: natural number equal to or larger than one)

In accordance with Equation (1), a capacitance between the cover 254 and the second electrode $R_i$ is proportional to the permittivity ε of the insulation member and the area $A_i$ of the electrode, and is inverse proportional to the thickness $d_i$ corresponding to a distance between the upper surface of the cover 254 and the electrode. The area Ai of the electrode corresponds to a value obtained by multiplying the width $w_i$ of the second electrode $R_i$ by the length L of the second electrode $R_i$, so that the capacitance Ci is proportional to the width $w_i$ of the second electrode $R_i$ and is inversely proportional to the thickness $d_i$.

In other words, as the thickness of the cover 254 is thicker, a value of the capacitance $C_i$ becomes smaller. Thus, when the width $w_i$ of the second electrode $R_i$ located in an area of the cover 254 of which the thickness $d_i$ is thick is formed widely, the capacitance $C_i$ can be secured which is equal to that of the second electrode $R_i$ located in an area of which the thickness $d_i$ is thin. Also, when the widths wi' of the first electrode Tj are formed differently, the same effect can be obtained.

When the widths $w_i$ of the second electrodes $R_i$ have the same value as in a general touch screen panel, the capacitance $C_i$ between each of the second electrodes $R_i$ and the upper surface of the cover 320 is changed according to a difference of the thickness. Thus, when an input device makes contact with the touch screen panel 150, the values of the capacitances at input locations are different from each other, thereby reducing touch input accuracy.

Meanwhile, in a case of the touch screen panel 150 according to the embodiments, the thickness $d_i$ of the cover 254, 554, 654 and 754 is not uniform. Thus, the uniform capacitance $C_i$ can be secured by changing the area of the first electrode $T_j$ or the second electrode $R_i$.

In the case of the third embodiment (See FIG. 6), the electrode groups G1 to G5 are formed, so that the areas are formed diversely, and a manufacturing process is simple.

Meanwhile, in the case of FIG. 7, all of the electrodes are formed on the same surface, which is different from FIG. 6. However, since a change in the capacitance between the patterned diamond-shaped electrodes is measured, the uniform capacitance Ci can be secured by adjusting and patterning the width of the first electrodes $T_1$ to $T_4$ and the second electrodes $R_1$ to $R_5$. The patterned shape is not limited to the diamond shape, and various shapes such as a polygonal shape, a circular shape, an elliptical shape, etc. may be applied thereto.

In summarization, when the values of the capacitances $C_i$ on the entire surface of the insulation member 252 are uniform as described above, the touch input coordinate values can be accurately obtained by measuring the change in the capacitance at a location where the first electrodes $T_j$ and the second electrodes $R_i$ intersect with each other.

Although various embodiments have been described up to now with reference to the accompanying drawings, the present invention is not limited to them.

Further, the terms "includes", "constitutes", or "has" mentioned above mean that a corresponding structural element is included unless they have no reverse meaning. Accordingly, it should be interpreted that the terms may not exclude but further include other structural elements. All the terms that are technical, scientific or otherwise agree with the meanings as understood by a person skilled in the art unless defined to the contrary. Common terms as found in dictionaries should be interpreted in the context of the related technical writings not too ideally or impractically unless the present disclosure expressly defines them so.

Although the embodiments of the present invention have been described for illustrative purposes, those skilled in the art will appreciate that various modifications, additions and substitutions are possible, without departing from the scope and spirit of the invention. Accordingly, the embodiments disclosed in the present invention are merely to not limit but describe the technical spirit of the present invention. Further, the scope of the technical spirit of the present invention is limited by the embodiments. The scope of the present invention shall be construed on the basis of the accompanying claims in such a manner that all of the technical ideas included within the scope equivalent to the claims belong to the present invention.

What is claimed is:

1. A touch screen panel comprising:
   a plurality of first electrodes arranged in a first direction in parallel, each of the plurality of first electrodes including first patterned portions that are electrically coupled to each other by first bridges;
   a plurality of second electrodes arranged in a second direction in parallel, each of the plurality of second electrodes including second patterned portions that are electrically coupled to each other by second bridges;
   a cover in which a thickness is varied in the first direction and a thickness is constant in the second direction, the cover overlying the plurality of first electrodes and the plurality of second electrodes;
   wherein each of the plurality of first electrodes has a first length extending parallel to the first direction and the first patterned portions of each of the plurality first electrodes has a width orthogonal to the first direction, the width of the first patterned portions of each of the plurality of first electrodes being equal along the length of each of the plurality of first electrodes and the width of the first patterned portions of all of the plurality of first electrodes being equal;
   wherein each of the plurality of second electrodes has a second length extending parallel to the second direction and the second patterned portions of each of the plurality of second electrodes has a width orthogonal to the second direction, the width of the second patterned portions of each of the plurality of second electrodes being equal along the length of the second electrode and the width of the second patterned portions of at least one of the plurality of second electrodes being different than the width of the second patterned portions of at least one other of the plurality of second electrodes;
   wherein a width of the first bridges of the plurality of first electrodes is narrower than the width of the first patterned portions of the plurality of first electrodes, the width of the first bridges being equal for all the plurality of first electrodes;
   wherein a width of the second bridges of the plurality of second electrodes are narrower than the width of the second patterned portions of the plurality of second electrodes, the width of the second bridges of at least one of the plurality of second electrodes being different than the width of the second bridges of at least one other of the plurality of second electrodes;
   wherein widths of the first patterned portions of the plurality of first electrodes are proportional to the thickness of the cover in the first direction;
   wherein widths of the second patterned portions of the plurality of second electrodes are proportional to the thickness of the cover in the second direction; and
   wherein the plurality of second electrodes are classified into a plurality of electrode groups, each electrode group including a pair of second electrodes, and wherein widths of the second patterned portions of the pair of second electrodes in each electrode group of the plurality of electrode groups are equal to each other and are different from widths of the second patterned portions of the pairs of second electrodes in the other electrode groups of the plurality of electrode groups.

2. A display device comprising:
   a display panel; and
   a touch screen panel including:
      a plurality of first electrodes arranged in a first direction in parallel, each of the plurality of first electrodes including first patterned portions that are electrically coupled to each other by first bridges;
      a plurality of second electrodes arranged in a second direction in parallel, each of the plurality of second electrodes including second patterned portions that are electrically coupled to each other by second bridges; and
      a cover in which a thickness is varied in the first direction and a thickness is constant in the second direction,
   wherein each of the plurality of first electrodes has a first length extending parallel to the first direction and the first patterned portions of each of the plurality first electrodes has a width orthogonal to the first direction, the width of the first patterned portions of each of the plurality of first electrodes being equal along the length of each of the plurality of first electrodes and the width of the first patterned portions of all of the plurality of first electrodes being equal;
   wherein each of the plurality of second electrodes has a second length extending parallel to the second direction and the second patterned portions of each of the plurality of second electrodes has a width orthogonal to the second direction, the width of the second patterned portions of each of the plurality of second electrodes being equal along the length of the second electrode and the width of the second patterned portions of at least one of the plurality of second electrodes being different than the width of the second patterned portions of at least one other of the plurality of second electrodes;

wherein a width of the first bridges of the plurality of first electrodes is narrower than the width of the first patterned portions of the plurality of first electrodes, the width of the first bridges being equal for all the plurality of first electrodes;

wherein a width of the second bridges of the plurality of second electrodes are narrower than the width of the second patterned portions of the plurality of second electrodes, the width of the second bridges of at least one of the plurality of second electrodes being different than the width of the second bridges of at least one other of the plurality of second electrodes;

wherein sizes of the first patterned portions of the plurality of first electrodes are proportional to the thickness of the cover in the first direction;

wherein sizes of the second patterned portions of the plurality of second electrodes are proportional to the thickness of the cover in the second direction; and wherein the plurality of second electrodes are classified into a plurality of electrode groups, each electrode group including a pair of second electrodes, and wherein widths of the second patterned portions of the pair of second electrodes in each electrode group of the plurality of electrode groups are equal to each other and are different from widths of the second patterned portions of the pairs of second electrodes in the other electrode groups of the plurality of electrode groups.

3. The display device of claim 2, wherein the display panel is one of a liquid crystal panel, a field emission panel, a plasma display panel, an organic light emitting diode panel, or an electrophoresis panel.

4. A touch screen panel comprising:

a cover including a first surface and an opposite second surface, a distance between the first and second surfaces varying along a first direction, the distance between the first and second surfaces of the cover being constant along a second direction, the second direction being transverse to the first direction;

a plurality of first electrodes extending in the first direction, each of the plurality of first electrodes including first patterned portions that are electrically coupled to each other by first bridges, wherein a width of the first bridges of the plurality of first electrodes are narrower than a width of the first patterned portions of the plurality of first electrodes, and sizes of the patterned portions of the plurality of first electrodes are proportional to the distance between the first and second surfaces of the cover in the second direction; and a plurality of second electrodes extending in the second direction, each of the plurality of second electrodes including second patterned portions that are electrically coupled to each other by second bridges, wherein a width of the second bridges of the plurality of second electrodes are narrower than a width of the second patterned portions of the plurality of second electrodes, the sizes of the patterned portions of the plurality of second electrodes are proportional to the distance between the first and second surfaces of the cover in the first direction, and a width of a second bridge of one of the plurality of second electrodes is different from a width of a second bridge of another of the plurality of second electrodes;

wherein each of the plurality of first electrodes has a first length extending parallel to the first direction and the width of the first patterned portions of each of the plurality first electrodes is orthogonal to the first direction, the width of the first patterned portions of each of the plurality of first electrodes being equal along the length of each of the plurality of first electrodes and the width of the first patterned portions of all of the plurality of first electrodes being equal;

wherein each of the plurality of second electrodes has a second length extending parallel to the second direction and the width of the second patterned portions of each of the plurality of second electrodes is orthogonal to the second direction, the width of the second patterned portions of each of the plurality of second electrodes being equal along the length of the second electrode and the width of the second patterned portions of at least one of the plurality of second electrodes being different than the width of the second patterned portions of at least one other of the plurality of second electrodes;

wherein the plurality of second electrodes are classified into a plurality of electrode groups, each electrode group including a pair of second electrodes, and wherein widths of the second patterned portions of the pair of second electrodes in each electrode group of the plurality of electrode groups are equal to each other and are different from widths of the second patterned portions of the pairs of second electrodes in the other electrode groups of the plurality of electrode groups.

5. The touch screen panel of claim 4, wherein each of the patterned portions of the plurality of first electrodes and the plurality of second electrodes has one of a polygonal shape, a circular shape, or an elliptical shape.

6. The touch screen panel of claim 4, wherein the second plurality of electrodes includes a first electrode, a second electrode, and a third electrode, the first electrode including patterned portions having a first width, the second electrode including patterned portions having a second width that is different from the first width, and the third electrode including patterned portions having a third width that is different from the first width and the second width.

7. A touch screen panel, comprising:

an insulation member having a surface and an opposite surface;

a plurality of first electrodes arranged in a first direction in parallel and formed on the surface of the insulation member, each of the plurality of first electrodes including first patterned portions that are electrically coupled to each other by first bridges;

a plurality of second electrodes arranged in a second direction in parallel and formed on the opposite surface of the insulation member, each of the plurality of second electrodes including second patterned portions that are electrically coupled to each other by second bridges;

a cover in which a thickness is varied in the first direction and a thickness is constant in the second direction;

wherein each of the plurality of first electrodes has a first length extending parallel to the first direction and the first patterned portions of each of the plurality first electrodes has a width orthogonal to the first direction, the width of the first patterned portions of each of the plurality of first electrodes being equal along the length of each of the plurality of first electrodes and the width of the first patterned portions of all of the plurality of first electrodes being equal;

wherein each of the plurality of second electrodes has a second length extending parallel to the second direction and the second patterned portions of each of the plurality of second electrodes has a width orthogonal to the second direction, the width of the second patterned portions of each of the plurality of second electrodes being equal along the length of the second electrode and the width of the second patterned portions of at least one of the plurality of second electrodes being different than the width of the second patterned portions of at least one other of the plurality of second electrodes;

wherein a width of the first bridges of the plurality of first electrodes is narrower than the width of the first patterned portions of the plurality of first electrodes, the width of the first bridges being equal for all the plurality of first electrodes;

wherein a width of the second bridges of the plurality of second electrodes are narrower than the width of the second patterned portions of the plurality of second electrodes, the width of the second bridges of at least one of the plurality of second electrodes being different than the width of the second bridges of at least one other of the plurality of second electrodes;

wherein widths of the first patterned portions of the plurality of first electrodes are proportional to the thickness of the cover in the first direction;

wherein widths of the second patterned portions of the plurality of second electrodes are proportional to the thickness of the cover in the second direction; and wherein the plurality of second electrodes are classified into a plurality of electrode groups, each electrode group including a pair of second electrodes, and wherein widths of the second patterned portions of the pair of second electrodes in each electrode group of the plurality of electrode groups are equal to each other and are different from widths of the second patterned portions of the pairs of second electrodes in the other electrode groups of the plurality of electrode groups.

8. A touch screen panel, comprising:

a plurality of first electrodes arranged in a first direction in parallel, each of the plurality of first electrodes including first patterned portions that are electrically coupled to each other by first bridges;

a plurality of second electrodes arranged in a second direction in parallel, each of the plurality of second electrodes including second patterned portions that are electrically coupled to each other by second bridges;

a cover in which a thickness is varied in the first direction and a thickness is constant in the second direction;

wherein each of the plurality of first electrodes has a first length extending parallel to the first direction and the first patterned portions of each of the plurality first electrodes has a width orthogonal to the first direction, the width of the first patterned portions of each of the plurality of first electrodes being equal along the length of each of the plurality of first electrodes and the width of the first patterned portions of all of the plurality of first electrodes being equal;

wherein each of the plurality of second electrodes has a second length extending parallel to the second direction and the second patterned portions of each of the plurality of second electrodes has a width orthogonal to the second direction, the width of the second patterned portions of each of the plurality of second electrodes being equal along the length of the second electrode and the width of the second patterned portions of at least one of the plurality of second electrodes being different than the width of the second patterned portions of at least one other of the plurality of second electrodes;

wherein a width of the first bridges of the plurality of first electrodes is narrower than the width of the first patterned portions of the plurality of first electrodes, the width of the first bridges being equal for all the plurality of first electrodes;

wherein a width of the second bridges of the plurality of second electrodes are narrower than the width of the second patterned portions of the plurality of second electrodes, the width of the second bridges of at least one of the plurality of second electrodes being different than the width of the second bridges of at least one other of the plurality of second electrodes;

wherein widths of the first patterned portions of the plurality of first electrodes are proportional to the thickness of the cover in the first direction;

wherein widths of the second patterned portions of the plurality of second electrodes are proportional to the thickness of the cover in the second direction;

wherein the plurality of first electrodes and the plurality of second electrodes are arranged as one continuous electrode in the same layer, respectively; and wherein the plurality of second electrodes are classified into a plurality of electrode groups, each electrode group including a pair of second electrodes, and wherein widths of the second patterned portions of the pair of second electrodes in each electrode group of the plurality of electrode groups are equal to each other and are different from widths of the second patterned portions of the pairs of second electrodes in the other electrode groups of the plurality of electrode groups.

9. The touch screen panel of claim 8, wherein the second patterned portions of the plurality of second electrodes has at least three different widths.

* * * * *